(12) United States Patent
Yamashita

(10) Patent No.: US 10,648,911 B2
(45) Date of Patent: May 12, 2020

(54) LIGHT EMITTING DEVICE

(71) Applicant: NICHIA CORPORATION, Anan-shi, Tokushima (JP)

(72) Inventor: Toshiaki Yamashita, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/814,828

(22) Filed: Nov. 16, 2017

(65) Prior Publication Data

US 2018/0149591 A1 May 31, 2018

(30) Foreign Application Priority Data

Nov. 30, 2016 (JP) .................. 2016-232743

(51) Int. Cl.
| | |
|---|---|
| *H01L 33/00* | (2010.01) |
| *G01N 21/64* | (2006.01) |
| *H01S 5/022* | (2006.01) |
| *H01S 5/40* | (2006.01) |
| *F21K 9/64* | (2016.01) |
| *H01S 5/00* | (2006.01) |

(Continued)

(52) U.S. Cl.
CPC .............. *G01N 21/64* (2013.01); *F21K 9/64* (2016.08); *F21S 41/16* (2018.01); *F21S 41/176* (2018.01); *F21V 9/30* (2018.02); *H01L 33/502* (2013.01); *H01S 5/005* (2013.01); *H01S 5/0071* (2013.01); *H01S 5/02212* (2013.01); *H01S 5/02216* (2013.01); *H01S 5/02296* (2013.01); *H01S 5/4031* (2013.01); *H01S 5/4087* (2013.01); *F21Y 2115/30* (2016.08); *G01N 2021/6419* (2013.01)

(58) Field of Classification Search
None
See application file for complete search history.

(56) References Cited

U.S. PATENT DOCUMENTS

| | | |
|---|---|---|
| 9,368,696 B1 | 7/2016 | Murofushi et al. |
| 2006/0152926 A1 | 7/2006 | Hama et al. |
| | (Continued) | |

FOREIGN PATENT DOCUMENTS

| | | |
|---|---|---|
| EP | 2074934 A2 | 7/2009 |
| EP | 2130484 A1 | 12/2009 |
| | (Continued) | |

OTHER PUBLICATIONS

Extended European Search Report of the corresponding European Patent Application No. 17203718.6, dated May 3, 2018.

*Primary Examiner* — Hung K Vu
(74) *Attorney, Agent, or Firm* — Global IP Counselors, LLP

(57) ABSTRACT

A light emitting device includes a fluorescent material, a first laser element and a second laser element. The first laser element is configured to emit a first laser light to excite the fluorescent material. The first laser light having a first peak wavelength that is shorter than an excitation peak wavelength of the fluorescent material. The second laser element is configured to emit a second laser light to excite the fluorescent material. The second laser light has a second peak wavelength that is longer than the excitation peak wavelength of the fluorescent material.

19 Claims, 3 Drawing Sheets

(51) Int. Cl.
*F21S 41/16* (2018.01)
*F21V 9/30* (2018.01)
*F21S 41/176* (2018.01)
*H01L 33/50* (2010.01)
*F21Y 115/30* (2016.01)

(56) References Cited

U.S. PATENT DOCUMENTS

| | | |
|---|---|---|
| 2008/0205477 A1 | 8/2008 | Hama et al. |
| 2008/0310472 A1 | 12/2008 | Imai |
| 2009/0008663 A1 | 1/2009 | Shimizu et al. |
| 2009/0167149 A1 | 7/2009 | Ito |
| 2009/0306478 A1 | 12/2009 | Mizuyoshi |
| 2010/0280322 A1 | 11/2010 | Mizuyoshi |
| 2012/0119638 A1 | 5/2012 | Sato et al. |
| 2013/0242532 A1 | 9/2013 | Nishimura et al. |
| 2013/0267781 A1 | 10/2013 | Ito |
| 2014/0140059 A1 | 5/2014 | Tamura et al. |
| 2014/0268642 A1 | 9/2014 | Ito |
| 2014/0268643 A1 | 9/2014 | Ito |
| 2014/0321151 A1 | 10/2014 | Sato et al. |
| 2015/0289764 A1* | 10/2015 | Tamura ............. A61B 1/041 600/476 |
| 2015/0338727 A1* | 11/2015 | Sugiyama ............. F21L 14/023 362/84 |
| 2016/0169461 A1 | 6/2016 | Ito |
| 2017/0108183 A1 | 4/2017 | Ito |
| 2017/0356613 A1 | 12/2017 | Van Bommel et al. |

FOREIGN PATENT DOCUMENTS

| | | |
|---|---|---|
| EP | 2738451 A1 | 6/2014 |
| JP | 2006-173324 A | 6/2006 |
| JP | 2007-294754 A | 11/2007 |
| JP | 2008-311320 A | 12/2008 |
| JP | 2009-001809 A | 1/2009 |
| JP | 2010-177368 A | 8/2010 |
| JP | 2011-101040 A | 5/2011 |
| JP | 2012-109400 A | 6/2012 |
| JP | 2013-191385 A | 9/2013 |
| JP | 2015-022955 A | 2/2015 |
| JP | 2015-103539 A | 6/2015 |
| JP | 2015-126160 A | 7/2015 |
| WO | 2013-150470 A1 | 10/2013 |
| WO | 2016087235 A1 | 6/2016 |
| WO | 2017-021087 A1 | 2/2017 |

\* cited by examiner

LIGHT EMITTING DEVICE

CROSS-REFERENCE TO RELATED PATENT APPLICATION

The present application claims priority under 35 U. S. C. § 119 to Japanese Patent Application No. 2016-232743, filed Nov. 30, 2016. The contents of this application are incorporated herein by reference in their entirety.

TECHNICAL FIELD

The present disclosure relates to a light emitting device and a method of producing the light emitting device.

BACKGROUND ART

Light emitting devices having a combination of a semiconductor laser and a fluorescent material have been used for various light sources (for example, Japanese Unexamined Patent Application Publication No. 2012-109400).

SUMMARY

A laser element more particularly a semiconductor laser element experiences shifts in output wavelength by temperature. The output wavelength shifts to longer wavelength side with a rise in temperature and to shorter wavelength side with a decrease in temperature. In contrast, even when temperature changes, excitation peaks of a fluorescent material substantially do not fluctuate. Laser light emitted by a laser element has a narrow full width half maximum in its emission spectrum, so that chromaticity of mixed light of a laser element and a fluorescent material tends to shift by temperature.

It is, therefore, one aim of certain embodiments is to provide a light emitting device configured with a combination of a laser element and a fluorescent material to emit mixed light, in which shift in chromaticity due to changes in temperature can be reduced.

The embodiments include the aspects described below. A light emitting device includes a fluorescent material, a first laser element and a second laser element. The first laser element is configured to emit a first laser light to excite the fluorescent material. The first laser light having a first peak wavelength that is shorter than an excitation peak wavelength of the fluorescent material. The second laser element is configured to emit a second laser light to excite the fluorescent material. The second laser light has a second peak wavelength that is longer than the excitation peak wavelength of the fluorescent material. A method of producing a light emitting device includes: providing a fluorescent material; dividing a plurality of laser elements into a shorter-wavelength group and a longer-wavelength group so that lights emitted from the laser elements in the shorter-wavelength group have peak wavelengths shorter than an excitation peak wavelength of the fluorescent material and lights emitted from the laser elements in the longer-wavelength group have peak wavelengths longer than the excitation peak wavelength of the fluorescent material; and selecting one or more of the laser elements from each of the shorter-wavelength group and the longer-wavelength group in combination with the fluorescent material to produce a light emitting device.

According to certain embodiments of the present invention, in a light emitting device configured with a laser element and a fluorescent material to emit mixed light, shift in chromaticity due to changes in temperature can be efficiently reduced.

DETAILED DESCRIPTION

Figure 1A:
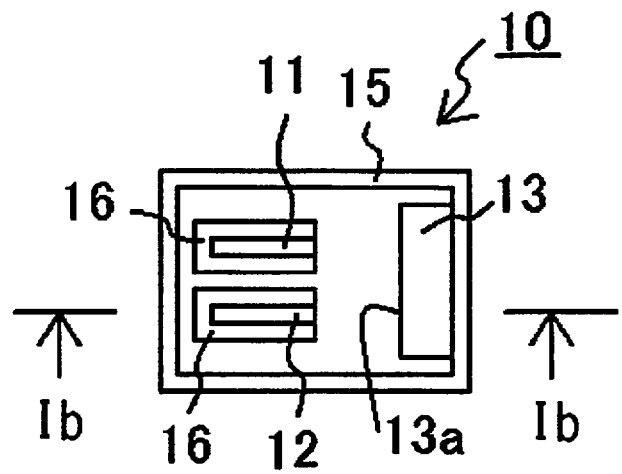
FIG. 1A is a plan view illustrating a schematic configuration of a light emitting device according to a first embodiment.

The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same reference numerals denote the same or like members and duplicative descriptions will be appropriately omitted.

Light Emitting Device 10

Figure 1B:
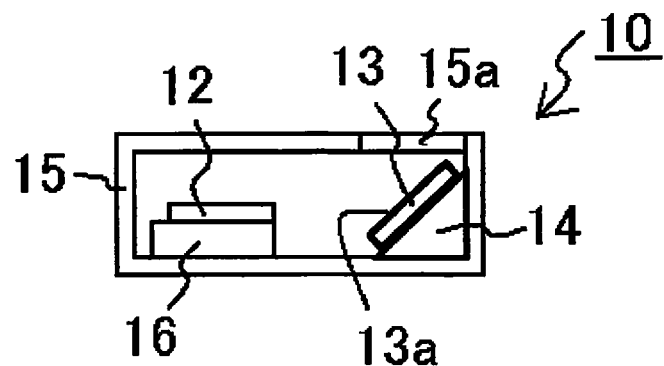
FIG. 1B is a schematic cross-sectional view taken along line Ib-Ib in FIG. 1A.

A light emitting device 10 is, for example, configured with a fluorescent member 13 containing a fluorescent material and a plurality of laser elements, as shown in FIG. 1A and FIG. 1B.

The plurality of laser elements is configured to emit laser light that can excite the fluorescent material, and includes a first laser element 11 and a second laser element 12.

The first laser element 11 and the second laser element 12 are configured to emit laser light with different peak wavelengths, and a peak wavelength of the first laser element 11 and a peak wavelength of the second laser element 12 are on both sides of an excitation peak wavelength of the fluorescent material.

Figure 5:
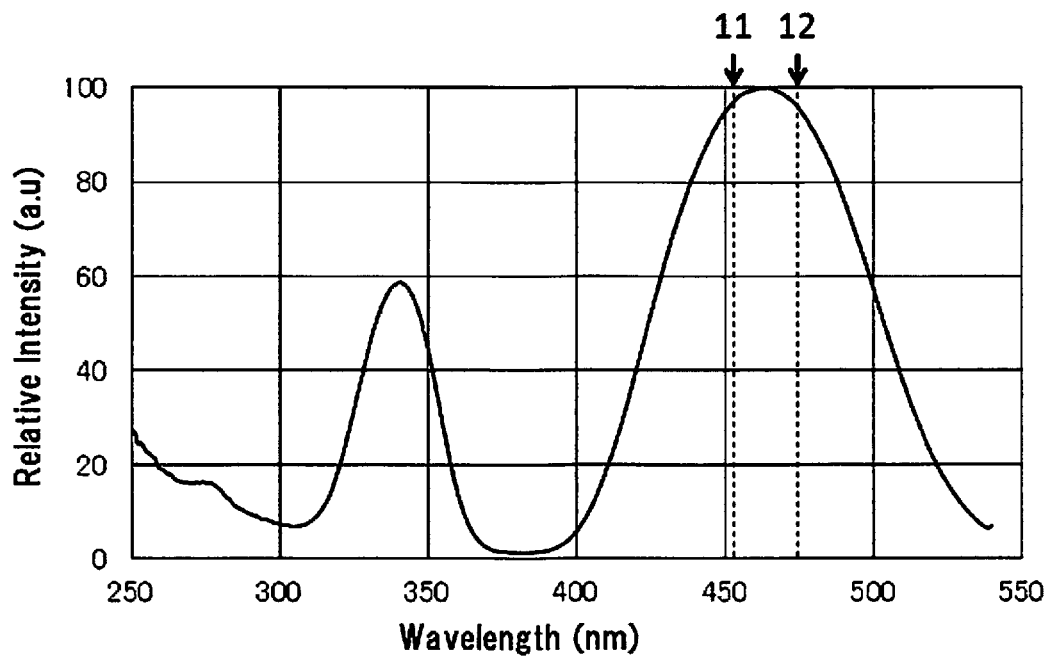
FIG. 5 is a graph showing an excitation spectrum of a YAG-phosphor.

With this configuration, even when occurrence of temperature change resulting in shifts in the peak emission wavelength of both the first laser element 11 and the second laser element 12, change in the chromaticity of light emitted from the light emitting device 10 can be reduced. As one example of excitation spectrum of a fluorescent material, an example of excitation spectrum of a YAG-phosphor is shown in FIG. 5. In FIG. 5, the ordinate represents relative intensity, the greater the relative intensity, the greater the excitation intensity. As shown in FIG. 5, for example, a configuration is assumed, in which the first laser element 11 emits laser light having a peak wavelength shorter than the excitation peak wavelength of the fluorescent material and the second laser element 12 emits laser light having a peak wavelength longer than the excitation peak wavelength of the fluorescent material. In this configuration, with a rise in temperature, both the peak wavelength of the first laser element 11 and the peak wavelength of the second laser element 12 shift to longer wavelength side. The peak wavelength of laser light of the first laser element 11 approaches the excitation peak wavelength of the fluorescent material, so that intensity of fluorescent light caused by the first laser element 11 increases, whereas the peak wavelength of laser light of the second laser element 12 departs from the excitation peak wavelength of the fluorescent material, so that intensity of fluorescent light caused by the second laser element 12 decreases. On the other hand, with a decrease in temperature, the peak wavelength of the first laser element 11 and the peak wavelength of the second laser element 12 shift to shorter wavelength side. The peak wavelength of laser light of the first laser element 11 departs from the excitation peak wavelength of the fluorescent material, so that intensity of fluorescent light caused by the first laser element 11 decreases, whereas the peak wavelength of laser light of the second laser element 12 approaches the excitation peak wavelength of the fluorescent material, so that intensity of fluorescent light caused by the second laser element 12 increases.

Accordingly, with a rise in temperature or with a decrease in temperature, change in intensity of entire fluorescent light can be reduced, so that shift amount of chromaticity of light emitted from the light emitting device 10 can be reduced. Such an effect is particularly advantageous in in-vehicle applications requiring a wide range of temperature, for example, from several tens of Celsius degrees below 0° C. to about 100° C. The chromaticity of light emitted from the light emitting device 10 may slightly shifts due to the shifts in the wavelength of the laser elements, but this shift in the chromaticity of light is much smaller than that due to a change in the excitation intensity of the fluorescent material, and can be substantially negligible.

Fluorescent Material

A fluorescent material is used to convert wavelength of at least a portion of laser light emitted from the laser element. A fluorescent material having an excitation peak in its excitation spectrum is employed. An excitation spectrum of a fluorescent material may have a plurality of excitation peaks, among those, the term "excitation peak" in the present specification refers to an excitation peak closest to the wavelength of excitation light, unless specifically indicated. The narrower the full width half maximum (FWHM, hereinafter may also referred to as "half bandwidth") of an excitation spectrum having the excitation peak, the greater influence a shift in wavelength of excitation light exerts. Accordingly, particularly, when a fluorescent material having a relatively narrow FWHM is used, the first laser element 11 and the second laser element 12 are preferably used as the excitation source. The term a "relatively narrow FWHM" refers to, for example, 110 nm or less, more preferably 90 nm or less, and further preferably 75 nm or less. Examples of the fluorescent materials having a relatively narrow FWHM include YAG-based fluorescent materials, LAG-based fluorescent materials, and TAG-based fluorescent materials. In particular, when a laser element having an active layer made of a GaN-based material is used, it is preferable to use a YAG-based fluorescent material that has high durability to laser light and can produce white light in combination with a blue laser. A plurality of types of fluorescent materials can be used and two or more types of fluorescent materials can be contained in the fluorescent member 13. When a plurality of types of fluorescent materials is used, an excitation peak of one fluorescent material having high emission intensity is preferably used as a standard. When two or more types of fluorescent materials are used, fluorescent light of one fluorescent material may excite other fluorescent materials. The reduction in the effect of the shifts in the wavelengths that to be obtained with the use of the first laser element 11 and the laser element 12 can be facilitated with the use of one type of fluorescent material, so that one type of fluorescent material is preferably used.

Fluorescent Member 13 Containing Fluorescent Material

The fluorescent member 13 may be singly made of a fluorescent material, but may be made of a fluorescent material and a binder configured to sustain the fluorescent material.

When the fluorescent member 13 is made only by a fluorescent material, less light scattering and higher light transmittance can be obtained.

When the fluorescent member 13 includes a binder, the binder is preferably made of an inorganic material. Accordingly, degradation, discoloration, or the like, of the binder caused by the light emitted from the laser light element can be reduced. Also, the wavelength converting member 13 is preferably made of a material having good light-resisting properties and heat-resisting properties so that deterioration or the like hardly occurs even when being irradiated with a light of high output power. For example, the material may have a melting point in a range of 1,000° C. to 3,000° C., preferably in a range of 1,300° C. to 2,500° C. Examples of the material of the inorganic material include ceramics. Among those, a material that contains aluminum oxide has good light transmissive properties and also has a proper melting point and good thermal conductive properties and is preferable. When the fluorescent member 13 is made of a mixture of a fluorescent material and a binder such as ceramics, the content ratio of the fluorescent material 13 can be 50 wt % or less or 30 wt % or less, and preferably 1 wt % or greater. When a reflection type in which one surface serves both an incident surface of the exciting light and a light-extracting surface of the fluorescent member 13, the content ratio of the fluorescent material may be 50 wt % or greater.

The fluorescent member 13 is, for example, a plate-like member. The fluorescent member 13 can have a substantially flat surface, and further can have a substantially flat upper surface and a substantially flat lower surface substantially in parallel to the upper surface. In the present specification, a substantially flat surface refers to a macroscopically flat surface which may have microscopically rough surface. When a rough surface is used for the light extracting surface of the fluorescent member 13, irregular reflection of light can be caused, allowing efficient mixing of fluorescent light and light from the laser elements. The light emitting device 10 that can produce such mixed light can be advantageous for applications that require a certain degree of evenness in the chromaticity distribution such as vehicular headlights or the like. In the present specification, the term a "rough surface" preferably refers, for example, to an arithmetical mean roughness Ra in a range of 0.2 or greater, and 1 or less is preferable.

In view of reduction in occurrence of cracks, improvement in handling, and heat dissipation performance, the thickness of the fluorescent member 13 is preferably in a range of 50 μm to 500 μm, more preferably in a range of 80

µm to 350 µm, for example. The fluorescent member 13 may have a partially different thickness.

First Laser Element 11, Second Laser Element 12

The light emitting device 10 includes at least two laser elements. Because light emitted from a laser element has high directivity, luminance of laser light is generally greater than light emitted from a light emitting diode (LED). Thus, with the use of laser elements, the light emitting device 10 having higher luminance than that obtained with LEDs can be realized. The light emitting device 10 may employ three or more laser elements.

Examples of the laser element include an element having a layered structure of semiconductor layers such as nitride-based semiconductors (typically represented by a formula $In_xAl_yGa_{1-x-y}N$, $0 \le x$, $0 \le y$, $x+y \le 1$). By adjusting the composition or the like, the oscillation wavelength of the laser element can be adjusted. For example, a laser element to emit ultraviolet light may be used, but a laser element to emit light in a range of ultraviolet light to blue-green light, with a peak oscillation wavelength in a range of 400 nm to 500 nm is preferably used. However, the laser element 11 and the second laser element 12 preferably have substantially the same layered structure of the semiconductor layers (designed values of compositions of respective semiconductor layers, layered orders, thicknesses, amounts of dopants, or the like). This is because different layered structures of semiconductor layers have different thermal characteristics, exhibiting different degrees of shifts in the wavelength due to the changes in the temperature. For example, when a plurality of laser elements are produced by similar design values, generally, unevenness in oscillation wavelengths occur. From those, the first laser element 11 and the second laser element 12 can be selected.

The peak wavelengths of the first laser element 11 and the second laser element 12 in the light emitting device 10 are on both sides of an excitation peak wavelength of the fluorescent material. The laser elements preferably have peak wavelengths, for example, in a range of 430 nm to 470 nm and in a range of 440 nm to 460 nm, respectively. The first laser element 11 and the second laser element 12 respectively emit laser light. The full width half maximum of laser light is smaller than that of LED light, and for example, 5 nm or less, preferably 4 nm or less. The peak wavelength of the first laser element 11 and the peak wavelength of the second laser element 12 are on both sides and preferably approximately symmetric with respect to the excitation peak wavelength of the fluorescent material. In the present specification, the term "approximately symmetric" allows a fluctuation of about plus or minus several nanometers. The peak wavelength of a laser element shifts by a change in temperature, but in the present specification, the term "peak wavelength" refers to a peak wavelength obtained by normal measurement, unless otherwise specified. Further, "a peak wavelength obtained by normal measurement" refers, for example, to a peak wavelength when the laser element is operated at room temperature.

The difference of peak wavelengths between the first laser element 11 and the second laser element 12 is preferably 6 nm or greater, more preferably 8 nm or greater, further preferably 10 nm or greater. Thus, the range of temperature in which the peak wavelengths of the first laser element 11 and the second laser element 12 interposes the excitation peak wavelength of the fluorescent material can be increased as the difference in the peak wavelengths increases. However, if the difference of peak wavelengths is too great, the laser light emitted from the first laser element 11 and the laser light emitted from the second laser element 12 have different colors. In order to maintain the desired emission color, the difference of peak wavelengths between the first laser element 11 and the second laser element 12 is preferably small so that the first laser element 11 and the second laser element 12 emit light that are perceived as the same color (for example, a blue color). More specifically, the difference of peak wavelengths between the first laser element 11 and the second laser element 12 is preferably 50 nm or less, more preferably 40 nm or less, further preferably 30 nm or less.

The first laser element 11 and the second laser element 12 respectively, preferably have peak wavelengths that can sufficiently excite the fluorescent material. More specifically, the peak wavelengths of the first laser element 11 and the second laser element 12 are respectively such that the fluorescent material is excited with an intensity that is 50% or greater, preferably 80% or greater, more preferably 85% or greater, further preferably 88% or greater, with respect to the excitation intensity at the excitation peak of the fluorescent material.

When an output of either one of the first laser element and the second laser element is assumed 100%, an output of the other of the first laser element 11 and the second laser element is preferably in a range of 80% to 100%. In the present specification, the term "substantially the same output" allows an output range of ±5% of the other. With the arrangement above, even when a change in temperature of the laser elements occur, a fluctuation in a sum of changes in excitation intensities of the fluorescent material due to the first laser element 11 and due to the second laser element 12 can be reduced. Accordingly, the change of intensity due to changes in temperature of the laser elements can be further reduced, and shifts in the chromaticity of light emitted from the light emitting device 10 can be further reduced.

In particular, the peak wavelength of the first laser element 11 is preferably shorter than the excitation peak wavelength of the excitation spectrum of the fluorescent material at room temperature and also at temperatures corresponding to 70% or greater of a driving temperature range of the light emitting device 10. Also, the peak wavelength of the second laser element 12 is preferably longer than the excitation peak wavelength of the excitation spectrum of the fluorescent material at room temperature and also at temperatures corresponding to 70% or greater of the driving temperature range of the light emitting device 10. It is further preferable that the peak wavelengths of the first and the second laser elements respectively satisfy the above. That is, even when the temperature of the laser elements change due to fluctuation in the driving of the laser elements and/or in the ambient temperature, at a most part in the driving temperature range of the light emitting device 10, the peak wavelengths of the laser elements are preferably maintained at both sides of the excitation peak of the fluorescent material. For the driving temperature range of the light emitting device 10, an operation guarantee temperature range of the light emitting device 10 can be applied. For example, a lower limit temperature is −20° C. or −40° C., and an upper limit temperature is 85° C. or 135° C. The driving temperature of the light emitting device 10 is measured, for example, at an ambient temperature Ta.

Figure 6:
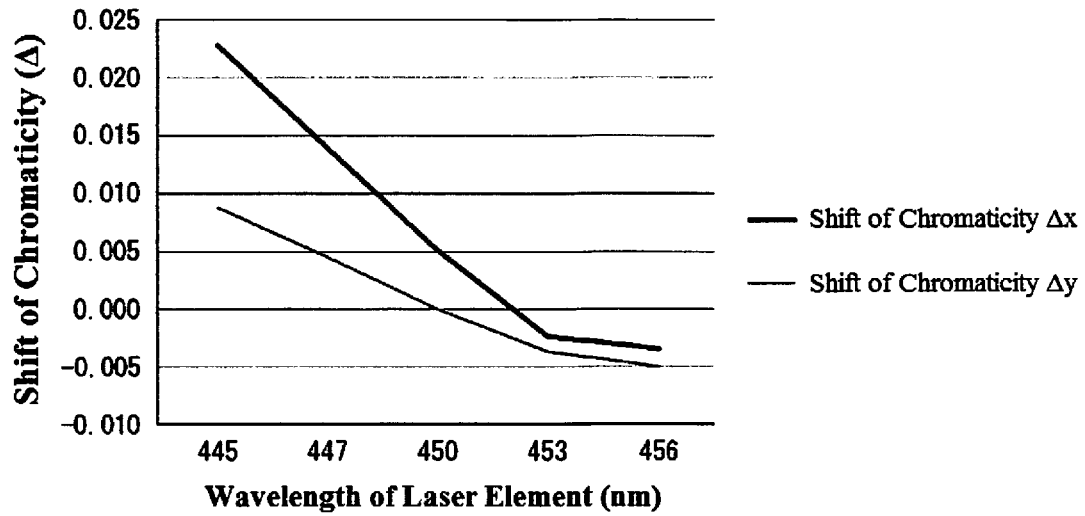
FIG. 6 is a graph showing relationships between peak wavelengths of a laser element at 25° C. and shift amounts of chromaticity coordinates corresponding to temperature change from 25° C. to 85° C.

In FIG. 6, shift amounts of chromaticity coordinates corresponding to change in the ambient temperatures from 25° C. to 85° C., obtained in a combination of a fluorescent member that contains a YAG fluorescent material having an excitation peak around 450 nm and laser elements. The wavelengths along the horizontal axis represent peak wavelengths of the laser elements measured at an ambient temperature of 25° C. A plural number of each of five types of laser elements having emission peak wavelengths of 445 nm, 447 nm, 450 nm, 453 nm, and 456 nm were provided and the chromaticities were measured at 25° C. and 85° C., respectively. Then, the differences in the chromaticities (Δ chromaticities) were calculated and average values of Δ chromaticities were plotted for each peak wavelength. The chromaticity x represents x-value in chromaticity coordinates and the chromaticity y represents y-value in chromaticity coordinates. The changes in wavelengths in the peak wavelengths of the laser elements at a temperature range of 25° C. to 85° C. were mean values plus about 4 nm.

As shown in FIG. 6, laser elements having peak wavelengths at longer wavelength side of the excitation peak wavelength of the fluorescent material tend to exhibit smaller absolute values of Δ chromaticities than that exhibited by the laser elements at shorter wavelength side. Although the reason for this tendency is not clear, one of the reasons can be that the excitation spectrum of the fluorescent material becomes broader with increasing temperature. Based on this tendency, when three or more laser elements are arranged in a single light emitting device 10, it is preferable to employ a larger number of the laser elements having peak wavelengths at longer wavelength side than the excitation peak wavelength of the fluorescent material. This is because the closer to zero the Δ chromaticities a combination of the laser elements exhibits, the more preferable the combination. Such a combination is particularly preferable when combining laser elements having peak wavelengths in a range of about 400 nm to about 500 nm with a YAG fluorescent material. When a plurality of laser elements are employed at the shorter wavelength side or the longer wavelength side of the excitation peak wavelength of the fluorescent material, the laser elements having approximately the same peak wavelengths (±3 nm, preferably ±1 nm) are preferably employed at the shorter wavelength side or the longer wavelength side, respectively. This configuration can facilitate calculation of shift amount of chromaticity of light emitted from the light emitting device 10.

The first laser elements 11 and the second laser elements 12 are arranged at locations so that laser lights emitted from the laser elements are directly or via an optical member irradiated on the fluorescent member 13. In this case, the first laser elements 11 and the second laser elements 12 are preferably arranged so that laser lights emitted from the first laser elements 11 and the laser lights emitted from the second laser elements 12 are irradiated on different regions of the fluorescent member 13. With this arrangement, a reduction in the luminous efficiency of the fluorescent material due to an increase in light density and/or a rise in temperature of the fluorescent member 13 can be reduced. Further, in this case, as shown in FIG. 1A and FIG. 1B, a single fluorescent member 13 is preferably used for a plurality of laser elements. With this arrangement, lights can be mixed in the fluorescent member 13, so that unevenness in the emission of the light emitting device 10 can be reduced. When a single fluorescent member 13 is used for a single laser element, a light scattering member configured to mix light from each of the fluorescent members 13 is preferably arranged opposite to the light extracting surfaces of the fluorescent members 13.

The laser elements are preferably arranged at locations spaced apart from the fluorescent member 13. Accordingly, the heat dissipation path of the laser elements and the heat dissipation path of the fluorescent member 13 can be separated, so that heat from each member can be efficiently dissipated.

Figure 2:
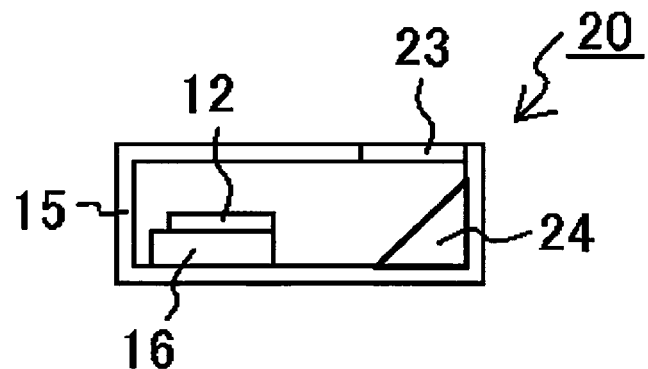
FIG. 2 is a schematic cross-sectional view of a light emitting device according to a second embodiment.
Figure 3:
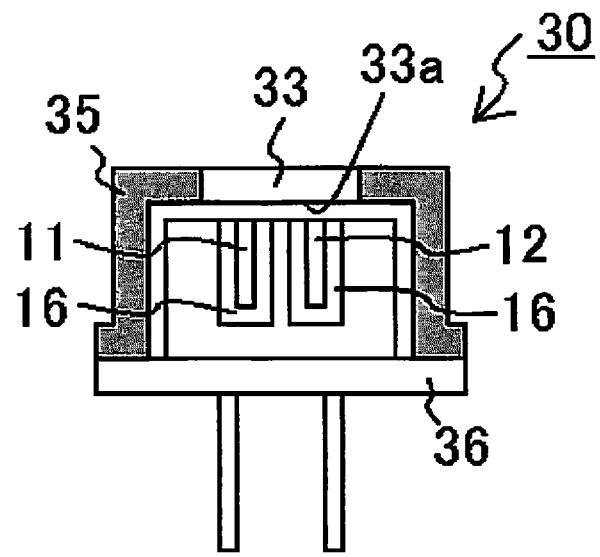
FIG. 3 is a schematic cross-sectional view of a light emitting device according to a third embodiment.
Figure 4:
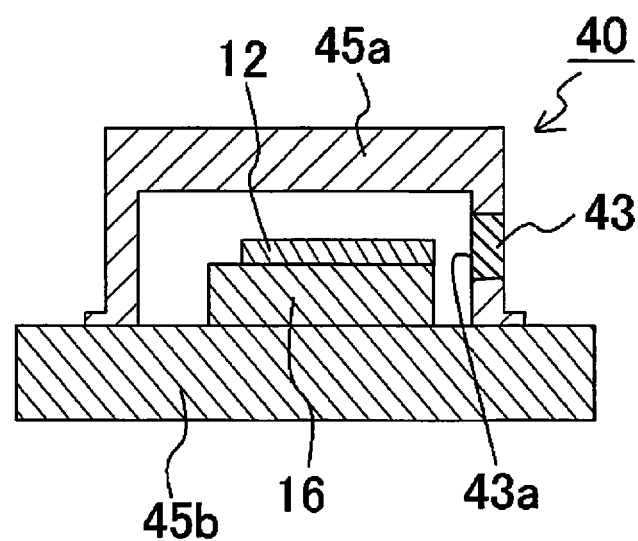
FIG. 4 is a schematic cross-sectional view of a light emitting device according to a fourth embodiment.

For example, as shown in FIGS. 1A, 1B, 3, and 4, the first and second laser elements 11 and 12 are arranged opposite to a first main surface 13a, 33a, 43a of the fluorescent member 13, 33, 43 so that light emitted from the laser elements 11 and 12 can be directly irradiated on the first main surface 13a, 33a, and 43a of the fluorescent member 13, 33, 43. The fluorescent member 13 may be configured so that, as shown in FIGS. 1A and 1B, the first main surface 13a serves as the light extracting surface, or as shown in FIGS. 3 and 4, a second main surface opposite from the first main surface 33a, 43a serves as the light extracting surface. Also, as shown in FIG. 2, the first and second laser elements 11 and 12 may be arranged at locations so as not opposite to the first main surface and the second main surface of the fluorescent member 23. In this case, lights emitted from the first and second laser elements 11 and 12 are reflected at a light reflecting member 24 or the like, to change the propagating directions of the light, thus, the lights can be irradiated on the first main surface of the fluorescent member 23. Alternatively, a light guide member such as optical fibermember is used to control the propagation direction of the light emitted from the laser elements, then the light emitted from the light guide member is irradiated on the first main surface of the fluorescent member.

Functional Layer Etc.

The fluorescent member has the light extracting surface and an excitation light incident surface. In FIGS. 1A and 1B, the excitation light incident surface is the same surface as the light extracting surface. In FIGS. 2 to 4, the excitation light incident surface is an opposite surface to the light extracting surface. The fluorescent member 13 may be provided with one or more functional layers. The one or more functional layers may be provided to the excitation light incident surface-side and/or the light extracting surface-side of the fluorescent member 13, either in a contacting state or in non-contacting state. For example, one or more types of layers, such as an antireflection layer to reduce reflection of laser light, a short-wavelength pass filter to transmit the excitation light and reflect fluorescent light, a long-wavelength pass filter to reflect the excitation light and transmit fluorescent light, etc., may be arranged on the excitation light incident surface or/and the light extracting surface of the fluorescent member 13.

Also, a light-reflecting film and/or a light-reflecting member 14 may be provided either in a contacting state or in non-contacting state, to a surface of the fluorescent member 13 except for the excitation light incidence surface and the light extracting surface of the fluorescent member 13. For example, when a reflecting type is employed, the light-reflecting film and/or the light-reflecting member 14 can be provided to a surface of the fluorescent member 13, which is opposite from the surface that is the excitation light incident surface and also the light extracting surface of the fluorescent member 13. The light-reflecting film and/or the light-reflecting member 14 preferably has a reflectance of 60% or greater, more preferably 90% or greater to the laser light. Also, the light-reflecting film and/or the light-reflecting member 14 preferably has a reflectance of 60% or greater, more preferably 90% or greater to the fluorescent light.

A light-transmissive member may be provided to one of the surfaces of the fluorescent member 13. The light-transmissive member preferably has a reflectance of 60% or greater, more preferably 80% or greater to the laser light. The light-transmissive member preferably has high transmittance to the fluorescent light as well as to the laser light.

Package 15

It is preferable that at least the laser elements are arranged in a package 15 and is hermetically sealed in the package 15. With this arrangement, accumulation of dust attracted to the laser lights emitted from the laser elements can be largely reduced.

The package 15 is preferably formed with a material having good heat dissipating properties, such as metal including copper, copper alloy, iron alloy, or the like, or ceramics including aluminum nitride or aluminum oxide. Generally, the package 15 includes for example, a base and a cap, which are bonded by using a eutectic material or the like, or by welding. The base and/or the cap of the package 15 may have made with an appropriate shape, for example, in a plan view, an approximately circular shape, an approximately elliptic shape, an approximately polygonal shape, or the like, can be employed.

The fluorescent member 13 is preferably arranged in contact with the package 15. Accordingly, heat generated from the fluorescent member 13, particularly, from the fluorescent material can be efficiently dispersed, and an improvement in the thermal characteristics, that is, an improvement in the luminous efficiency at a high temperature can be achieved. The fluorescent member 13 can be arranged in the package 15 or at a location covering the light extracting window of the package 15.

Alternatively, the fluorescent member 13 can be arranged at a location outside of the package 15. For example, the laser elements are hermetically sealed in the package 15 and the laser light emitted from the package 15 can be directly or through a relay member such as an optical fiber, irradiated on the fluorescent member 13. In this case, the package 15 is not included in the heat dissipating path of the fluorescent member 13, so that a different heat dissipating member that can serve as the heat dissipating path of the fluorescent member 13 is preferably arranged.

Sub-Mount 16

The laser elements can be arranged in the package 15 directly or via a sub-mount 16 or the like. For example, arranging the laser elements on an upper surface of the base of the package 15 via a sub-mount 16 allows for spacing the light-emitting end surface of each of the laser elements apart from the upper surface of the base, so that lights from the laser elements can be prevented from hitting the upper surface of the base. Moreover, the sub-mount 16 can be used to improve the heat dissipation performance. The sub-mount can be made of, for example, aluminum nitride, silicon carbide, or the like.

Condensing Lens

In the light emitting device 10, a lens such as a condensing lens may be arranged in the path between the laser elements and the fluorescent member 13 and/or in the path of the light from the fluorescent member 13. Accordingly, adjustment of the range irradiated with lights from the laser elements and/or light from the fluorescent member 13 can be facilitated. Unless otherwise specifically noted, the detail of the fluorescent member 13 described above can also be applied to the fluorescent members 23, 33 and 43.

Method of Producing Light Emitting Device 10

When manufacturing a light emitting device 10 as described above, first, a fluorescent material may be selected and provided. The fluorescent material can be appropriately selected from the fluorescent materials that can be excited by laser lights emitted from certain laser elements.

Next, selecting a plurality of laser elements having different peak wavelengths near and either side of the excitation peak wavelength of the fluorescent material, and dividing the plurality of laser elements into two groups of a shorter-wavelength group and a longer-wavelength group, with respect to the excitation peak wavelength of the fluorescent material. It is preferable that the wavelength ranges of the two groups are respectively sufficient to excite the fluorescent material. More specifically, it is preferable that the wavelength ranges are respectively such that the fluorescent material is excited with an intensity that is 80% or greater with respect to the peak excitation intensity of the fluorescent material.

Then, one or more laser elements are selected from each of the two groups, and those laser elements are used in combination with the selected fluorescent material to obtain the light emitting device 10.

According to the method of producing as described above, the light emitting device 10 in which variation of intensity due to changes in temperature of the laser elements can be reduced, and variation in the chromaticity of light emitted from the light emitting device 10 can be reduced.

First Embodiment

As shown in FIGS. 1A and 1B, a light emitting device 10 according to a first embodiment includes a fluorescent member 13 containing a fluorescent material and a first laser element 11 and a second laser element 12. FIG. 1A is a plan view illustrating a schematic configuration of a light emitting device 10. The cap of the light emitting device 10 is omitted for clarity.

The fluorescent member 13, the first laser element 11, and the second laser element 12 are hermetically sealed in the package 15. The package 15 may be made of, for example, KOVAR®. As shown in FIG. 1B, a light extracting window 15a for extracting light is provided in a part of an upper surface of the package 15. For example, the light extracting window 15 is made of glass, in a rectangular shape when seen from above, with dimensions of 2 mm by 2 mm.

The fluorescent member 13 has a plate-like shape and made of a sintered body of a YAG fluorescent material (excitation spectrum having the excitation peak at 450 nm with a half bandwidth of 100 nm) and aluminum oxide (melting point: about 1,900° C. to about 2,100° C.). The YAG fluorescent material is contained in an amount of 3 wt % with respect to the total weight of the fluorescent member 13. The fluorescent member 13 has dimensions of, for example, 1 mm×1 mm×0.5 mm. The fluorescent member 13 is arranged so that a first main surface 13a of the fluorescent member 13 is at an angle of 45 degrees to the path of laser lights emitted from the first and second laser elements 11 and 12.

A light-reflecting member 14 is arranged on a second main surface (a surface that is not opposite to the laser elements) of the fluorescent member 13. The light-reflecting member 14 is arranged at a position so that light from the laser element 11 can be reflected toward the light extracting window 15a. The light-reflecting member 14 has, for example, a triangular prism shape. The light-reflecting member 14 is configured so that one of the rectangular side surfaces of the triangular prism shape reflects lights from the first and second laser elements 11 and 12. The light-reflecting member 14 is made of, for example, aluminum. The light-reflecting member 14 is arranged so that approximately the entire surfaces of the side surfaces other than the side surface provided with the fluorescent member 13 are tightly in contact with the package 15.

The first and second laser elements 11 and 12 have peak wavelengths of 445 nm and 455 nm, respectively (a difference of 10 nm), and half bandwidths of 1 nm and 1 nm, respectively, when measured at room temperature. The first laser element 11 and the second laser element 12 have peak wavelengths corresponding to the excitation intensities 95% and 99% of the excitation peak of the fluorescent material, respectively. When assuming the output of the first laser element 11 as 100%, the output of the second laser element 12 is 96%.

The first and second laser elements 11 and 12 exhibit shifts in the peak wavelengths from room temperature, about −3.4 nm at −40° C. and about +4.2 nm at 85° C., respectively. Thus, at least at temperatures in a range of −40° C. to 85° C., the peak wavelengths of the first and second laser elements 11 and 12 are at the both sides of the excitation peak wavelength of the fluorescent material. When the driving temperature range of the light emitting device 10 is −40° C. to 135° C., the range of −40° C. to 85° C. corresponds to about 71% of the driving temperature range. That is, the peak wavelength of the first laser element 11 is shorter than the excitation peak wavelength of the excitation spectrum of the YAG fluorescent material at room temperature, and also at temperatures corresponding to 70% or greater of a driving temperature range of the light emitting device. Also, the peak wavelength of the second laser element 12 is longer than the excitation peak wavelength of the excitation spectrum of the YAG fluorescent material at room temperature, and also at temperatures corresponding to 70% or greater of the driving temperature range of the light emitting device.

The first laser element 11 and the second laser element 12 are arranged approximately in parallel to each other when viewed from above, on the sub-mounts 16 made of aluminum nitride (AlN) so that laser lights emitted from the laser elements are irradiated on different regions of the fluorescent member 13.

With such a configuration, light emitted from the first and second laser elements 11 and 12 can be incident on the fluorescent member 13 and the incident lights can be extracted by using the light-reflecting member 14. During such operation, the temperatures of the laser elements change due to the driving of the light emitting device 10 and the environmental temperature in operation, and the wavelengths of the laser lights shift with the changes of the temperature of the laser elements. However, in this case, with the use of two wavelength ranges of laser elements, that is, the first and second laser elements 11 and 12, having peak wavelengths at both sides of the excitation peak wavelength of the fluorescent material, fluctuations in the sum of excitation intensity of the fluorescent material due to the first and second laser elements 11 and 12 can be reduced. Accordingly, an amount of variation in chromaticity of light extracted from the light emitting device 10 can be reduced.

The light emitting device 10 as described above can be advantageous for use in in-vehicle applications, which would be subjected to environmental temperature changes, for example, from several tens of Celsius degrees below 0° C. to about 100° C.

Moreover, when a single fluorescent member 13 and the first and second laser elements 11 and 12 are hermetically sealed in a single package 15, the temperature within the package can be assumed to be approximately uniform, so that the first and second laser elements 11 and 12 can exhibit approximately same amount of shifts in the peak wavelength. Accordingly, adjustment of chromaticity of light emitted from the light emitting device 10 can be performed easily.

Second Embodiment

As shown in FIG. 2, in a light emitting device 20 according to a second embodiment, a fluorescent member 23 has a plate-like shape and is arranged engaged in a light extracting window of a package 15. A light-reflecting member 24 is arranged such that one surface of the light-reflecting member 24 is at an angle of 45 degrees to a path of laser lights emitted from a first laser element 11 and a second laser element 12 to reflect the laser lights, and further, the reflected lights are incident on the fluorescent member 23. Other configurations may be similar to that in the light emitting device 10, and similar effects can be obtained.

The light emitting device 20 can exhibit similar performance characteristics as the light emitting device 10.

Third Embodiment

As shown in FIG. 3, a light emitting device 30 according to a third embodiment includes a first laser element 11 and a second laser element 12, a cap 35 defining a through-hole along optical paths of the first and second laser elements 11 and 12, and a fluorescent member 33 disposed in the through-hole.

The first and second laser elements 11 and 12 are arranged on a stem 36 via sub-mounts 16 so that lights emitted from the laser elements are respectively irradiated on different regions of a first main surface 33a of the fluorescent member 33. The stem 36 is hermetically sealed with the cap 35. The cap 35 and the stem 36 together form the package.

The configurations other than those described above are substantially similar to that in the light emitting device 10.

The light emitting device 30 can exhibit similar performance characteristics as the light emitting device 10.

Fourth Embodiment

As shown in FIG. 4, in a light emitting device 40 according to a fourth embodiment, a first laser element 11 and a second laser element 12 are arranged substantially in parallel to each other, on an upper surface of the base 45b of a package via sub-mounts 16 respectively. A through hole corresponding to the light emitting surfaces of the first and second laser elements 11 and 12 is defined in a portion of a lateral wall of a cap 45a of the package, and a fluorescent member 43 is arranged in the through hole. The first and second laser elements 11 and 12 are arranged so that laser lights emitted from the first and second laser elements 11 and 12 are irradiated on different regions of a first main surface 43a of the fluorescent member 43.

Other configurations may be similar to that in the light emitting device 10, and similar effects can be obtained.

The light emitting device 40 can exhibit similar performance characteristics as the light emitting device 10. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
one or more types of fluorescent materials including a first fluorescent material;
a first laser element configured to emit a first laser light to excite the first fluorescent material, the first laser light having a first peak wavelength that is shorter than an excitation peak wavelength of the first fluorescent material; and
a second laser element configured to emit a second laser light to excite the first fluorescent material, the second laser light having a second peak wavelength that is longer than the excitation peak wavelength of the first fluorescent material, wherein
a difference between the first peak wavelength of the first laser light and the second peak wavelength of the second laser light is 40 nm or less.

2. The light emitting device according to claim 1, wherein the first fluorescent material has an excitation spectrum having an excitation peak with a full width at half maximum of 110 nm or less.

3. The light emitting device according to claim 1, wherein the first peak wavelength of the first laser light and the second peak wavelength of the second laser light respectively correspond to wavelengths at which an excitation intensity of the first fluorescent material is 80% or greater with respect to the excitation intensity of the first fluorescent material at the excitation peak wavelength.

4. The light emitting device according to claim 1, wherein the first laser light emitted from the first laser element and the second laser light emitted from the second laser element respectively have a full width at half maximum of 5 nm or less.

5. The light emitting device according to claim 1, wherein an output of one of the first laser element and the second laser element is in a range of 80% to 100% with respect to an output of the other of the first laser element and the second laser element.

6. The light emitting device according to claim 5, wherein the first peak wavelength of the first laser light is shorter than the excitation peak wavelength of the excitation spectrum of the first fluorescent material at room temperature, and also at temperatures corresponding to 70% or greater of a driving temperature range of the light emitting device, and
the second peak wavelength of the second laser light is longer than the excitation peak wavelength of the excitation spectrum of the first fluorescent material at room temperature, and also at temperatures corresponding to 70% or greater of the driving temperature range of the light emitting device.

7. The light emitting device according to claim 6, wherein the first peak wavelength of the first laser light and the second peak wavelength of the second laser light are respectively in a range of 400 nm to 500 nm.

8. The light emitting device according to claim 7, wherein the first fluorescent material is YAG-based fluorescent material.

9. The light emitting device according to claim 6, wherein the first peak wavelength of the first laser light and the second peak wavelength of the second laser light respectively correspond to wavelengths at which an excitation intensity of the first fluorescent material is 80% or greater with respect to the excitation intensity of the first fluorescent material at the excitation peak wavelength.

10. The light emitting device according to claim 6, wherein
a difference between the first peak wavelength of the first laser light and the second peak wavelength of the second laser light is 6 nm or greater.

11. The light emitting device according to claim 1, wherein
the first peak wavelength of the first laser light is shorter than the excitation peak wavelength of the excitation spectrum of the first fluorescent material at room temperature, and also at temperatures corresponding to 70% or greater of a driving temperature range of the light emitting device, and
the peak wavelength of the second laser light is longer than the excitation peak wavelength of the excitation spectrum of the first fluorescent material at room temperature, and also at temperatures corresponding to 70% or greater of the driving temperature range of the light emitting device.

12. The light emitting device according to claim 1, wherein
the first laser element and the second laser element are arranged in a single package.

13. The light emitting device according to claim 1, wherein
the first peak wavelength of the first laser light and the second peak wavelength of the second laser light are respectively in a range of 400 nm to 500 nm.

14. The light emitting device according to claim 1, wherein
the first fluorescent material is YAG-based fluorescent material.

15. The light emitting device according to claim 1, wherein
a difference between the first peak wavelength of the first laser light and the second peak wavelength of the second laser light is 6 nm or greater.

16. The light emitting device according to claim 15, wherein
a difference between the first peak wavelength of the first laser light and the second peak wavelength of the second laser light is 30 nm or less.

17. The light emitting device according to claim 1, further comprising
a fluorescent member having a plate-like shape and containing the first fluorescent material, wherein the fluorescent member is arranged at a location irradiated with the first laser light emitted from the first laser element and the second laser light emitted from the second laser element.

18. The light emitting device according to claim 17, wherein
the first laser element and the second laser element are arranged at locations so that the first laser light and the second laser light are irradiated to different regions of the fluorescent member.

19. The light emitting device according to claim 1, wherein
   the first peak wavelength of the first laser light and the second peak wavelength of the second laser light are within the same color range.

* * * * *